United States Patent [19]

Shiell

[11] 4,383,217
[45] May 10, 1983

[54] COLLINEAR FOUR-POINT PROBE HEAD AND MOUNT FOR RESISTIVITY MEASUREMENTS

[76] Inventor: Thomas J. Shiell, P.O. Box 504, Menlo Park, Calif. 94025

[21] Appl. No.: 260,468

[22] Filed: May 4, 1981

Related U.S. Application Data

[62] Division of Ser. No. 38, Jan. 2, 1979.

[51] Int. Cl.$^3$ ............................................. G01R 31/22
[52] U.S. Cl. ............................ 324/158 F; 324/73 PC
[58] Field of Search ............ 324/158 F, 158 P, 73 AT, 324/73 PC

[56] References Cited

U.S. PATENT DOCUMENTS

| 3,009,109 | 11/1961 | Jankowski | 324/158 P |
| 3,038,121 | 6/1962 | Gray et al. | 324/158 F |
| 3,996,517 | 12/1976 | Fergason et al. | 324/73 AT X |
| 4,225,819 | 9/1980 | Grau et al. | 324/73 PC X |

FOREIGN PATENT DOCUMENTS 399799  2/1974  U.S.S.R. .......................... 324/73 PC

Primary Examiner—Stanley T. Krawczewicz
Attorney, Agent, or Firm—John L. McGannon

[57] ABSTRACT

An improved resistivity probe comprised of a rigid strip of electrically nonconducting material having a number of metallic, generally parallel pins coupled thereto. The strip can be mounted in a vertically shiftable probe head in any suitable manner. In one embodiment, the pins are rigidly secured by an epoxy to the strip. In another embodiment, the probe includes a pair of rigid strips having semi-cylindrical recesses on the inner faces thereof for receiving therebetween a number of resistivity measuring pins. The strips are held together by rivets or other fasteners. A multiple probe assembly can be made with a disk-like body having a number of angularly disposed slots therethrough for receiving a number of probes with each probe including a rigid strip having a number of pins coupled thereto. The probes extend into respective slots of the body so that the pins project downwardly from the lower face of the body to permit multiple resistivity measurements to be made without having to rotate the probes. An improved mount for a resistivity probe includes an arm mounted on an upright post for up and down movement, and a moving means which can be electrical, pneumatic, hydraulic or vacuum operated, can be used raising and lowering the arm. A single probe or a multiple probe assembly can be used on the outer end of the arm for making resistivity measurements.

7 Claims, 9 Drawing Figures

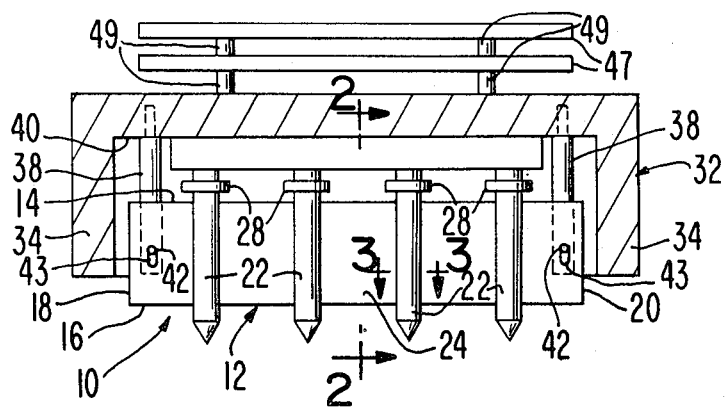
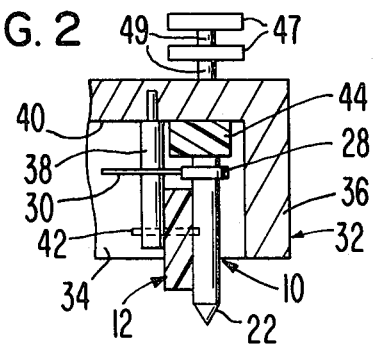
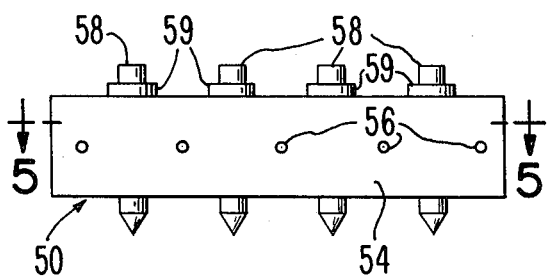
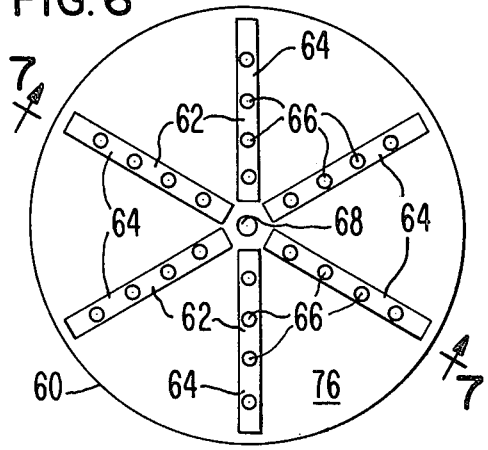
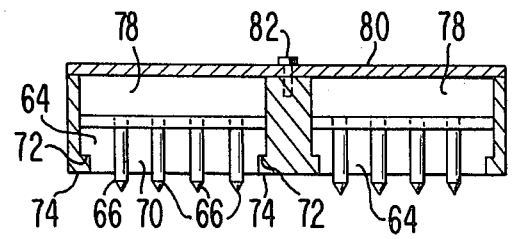

COLLINEAR FOUR-POINT PROBE HEAD AND MOUNT FOR RESISTIVITY MEASUREMENTS

This is a division of application Ser. No. 000,038, filed Jan. 2, 1979.

This invention relates to improvements in the making of resistivity measurements and, more particularly, to an improved resistivity probe and a mount for such a probe.

BACKGROUND OF THE INVENTION

The measurement of resistivity of semiconductor wafers is an essential part of the processing of such wafers. A number of different types of probes and probe mounts have been conventionally provided for making such measurements. Typical of probes of this nature are those of the type made and sold by Kulicke and Soffa Industries, Inc. of Horsham, Pa. and identified as Fell Resistivity Probe Head, and Kullicke and Soffa Disposable Probe Head. This company also produces the Model 3007A wafer locating resistivity probe base and the Model 5000 resistivity calculator, the latter including mounts for the Fell and disposable probe heads. Other companies which make mounts for probes of this type include Signatone Corporation of Santa Clara, Calif. and Macronetics, Inc. of Mountain View, Calif.

For the most part, the wafer engaging pins of conventional resistivity probes are shiftable relative to the heads which carry the probes. An explanation of the construction of conventional probes is set forth in the periodical, Solid State Technology, June 1969, in an article entitled "Mechanical Aspects of Testing Resistivity of Semiconductor Materials and Diffused Layers," by P. P. Clerx. In this article, it is made clear that the various pins of a probe head are shiftable relative to each other and have individual springs which bias the pins downwardly yet allow the pins to move upwardly when the lower ends of the pins engage selected locations on a semiconductor wafer whose resistivity is to be measured.

While the foregoing probe heads have been suitable for a number of different applications, they require extremely high accuracy in mounting and the use of individual springs for bias forces for seriously affecting their reliability so that the production costs have been relatively high. Since the pins experience wear and are often times having to be replaced, a need for a more economical way of mounting the pins and replacement of the probe has arisen to offset production and operational costs.

SUMMARY OF THE INVENTION

The present invention satisfies the aforesaid need by providing improvements in the construction and mounting of probe heads for resistivity measurements. To this end, the present invention provides several embodiments of probe heads which can be constructed in a simple manner and at minimum cost yet the probe heads can be quickly and easily mounted in a probe head for immediate use in taking resistivity measurements of semiconductor wafers.

In one embodiment of the invention, the probe includes a rigid strip of plastic or other non-conducting material and a number of spaced, generally parallel pins secured on one side face of the strip by an adhesive, such as an epoxy. The pins project upwardly from the upper edge of the strip and downwardly from its lower edge, and the pins are pointed so that they can make point contact with a semiconductor wafer during resistivity measurements. The upper ends of the pins are provided with collars which make electrical contact with the pins and provide the means by which wires can be attached to the pins themselves. The rigid strip can be shiftably secured in any suitable manner in a probe head or housing with a height bar of rubber or the like engaging the flat upper faces of the pins to limit upward movement of the strip and pins as a unit. One or more weight or gram loading bars can be coupled with the probe to provide specific loading for the pins. Such loading will provide the necessary control and accuracy needed to make resistivity measurements.

Another embodiment of the probe of this invention includes a pair of rigid strips having semi-cylindrical recesses on their inner surfaces so that the pins can be received in the recesses and slightly movable between the strips to form a probe that can be mounted in a probe head as mentioned above with respect to the first-mentioned probe, yet the probe unit can be used with gram loading bars for the previously mentioned purpose.

A multiple probe assembly can be formed from a disk-like body having a number of angularly disposed slots therethrough located about the central axis of the body. The slots receive respective probes of one of the types mentioned above so that the pins of the probes extend downwardly from the lower face of the body for simultaneously engaging a large number of locations on a semiconductor wafer whose resistivity is to be measured. Thus, multiple resistivity readings can be taken at the same time rather than just a relatively few readings as would ordinarily be capable only with a single probe. This eliminates having to rotate the probe assembly as is the case when using a simple probe.

The present invention further contemplates the use of an improved mount for a probe head wherein a counterbalanced arm is shiftably mounted on an upright post carried on a base plate, and moving means engagable with the arm is adapted to raise and lower the arm depending upon the direction of desired travel of the probe head. The moving means can be operated electrically, pneumatically, hydraulically or by vacuum. The control means for the moving means can be operated to assure gentle, even movement of the pins of the probe so that the pins will not damage the semiconductor wafer to be measured yet a relatively few or relatively large number of resistivity measurements can be taken simultaneously depending upon the type of probe structure which is used.

The primary object of this invention is to provide improvements in the construction of resistivity probes for use with and without gram loading bars wherein the probes are constructed in a manner to minimize production costs yet assure high reliability and accuracy in making resistivity measurements yet permit quick replacement of the probes if deemed necessary or desirable.

Another object of the present invention is to provide an improved mount for a resistivity probe wherein greater control of the raising and lowering of the probe can be achieved at minimum costs and with high reliability.

Other objects of this invention will become apparent as the following specification progresses, reference being had to the accompanying drawings for an illustration of several embodiments of the invention.

IN THE DRAWINGS

FIG. 1 is a front elevational view of a first embodiment of the resistivity probe of the present invention, showing the way in which the probe can be mounted on a housing which is raised and lowered relative to a semiconductor wafer whose resistivity is to be measured;

FIG. 2 is a cross-sectional view taken along line 2—2 of FIG. 1;

FIG. 3 is a cross-sectional view taken along line 3—3 of FIG. 1;

FIG. 4 is a view similar to FIG. 1 but showing another embodiment of the resistivity probe of this invention;

FIG. 5 is a cross-sectional view taken along line 5—5 of FIG. 4;

FIG. 6 is a bottom plan view of a disk carrying a number of angularly disposed resistivity probes for use in making resistivity measurements at a large number of locations on a semiconductor wafer;

FIG. 7 is a cross-sectional view taken along line 7—7 of FIG. 6;

Figure 8:
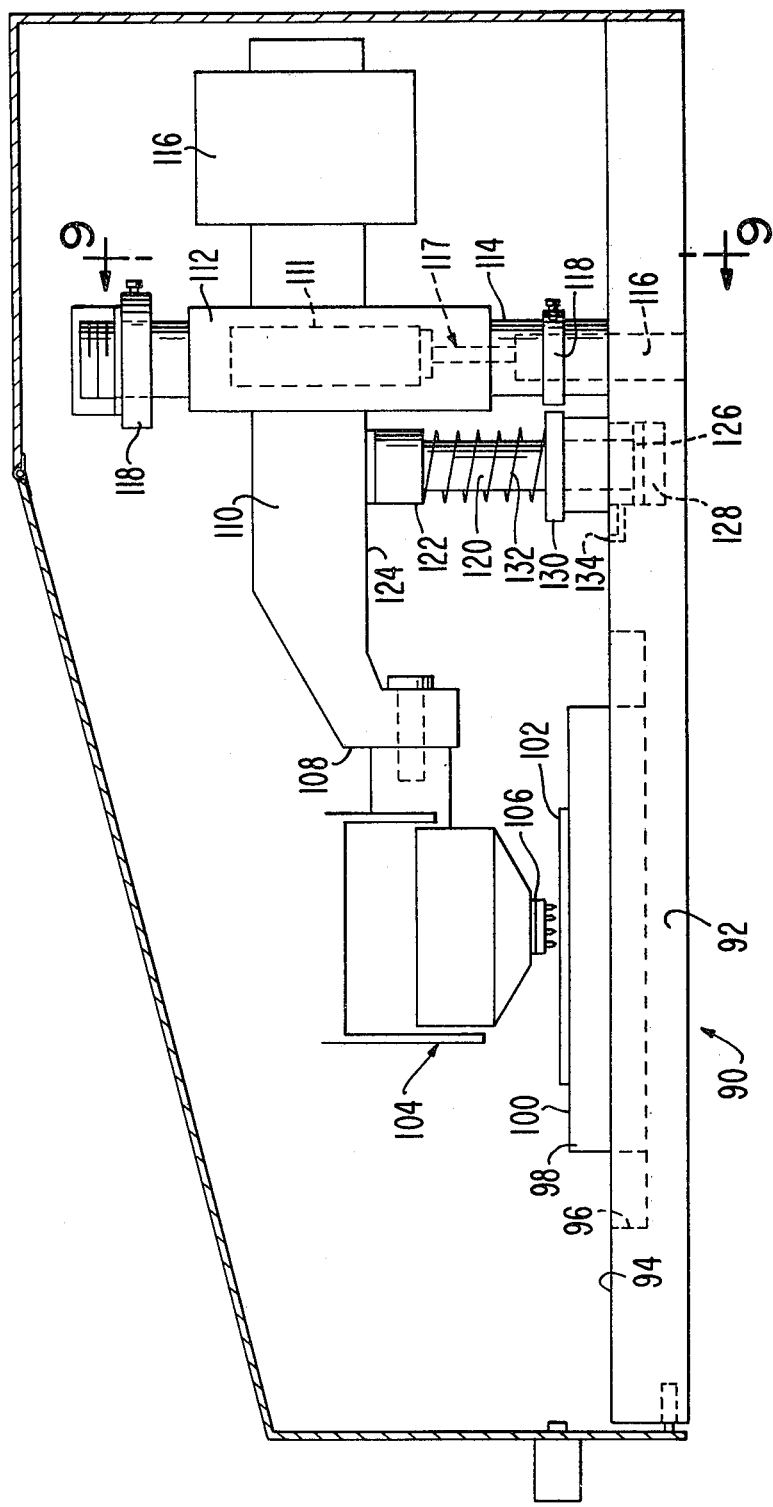
FIG. 8 is a side elevational view of the mounting stand for a resistivity probe.
Figure 9:
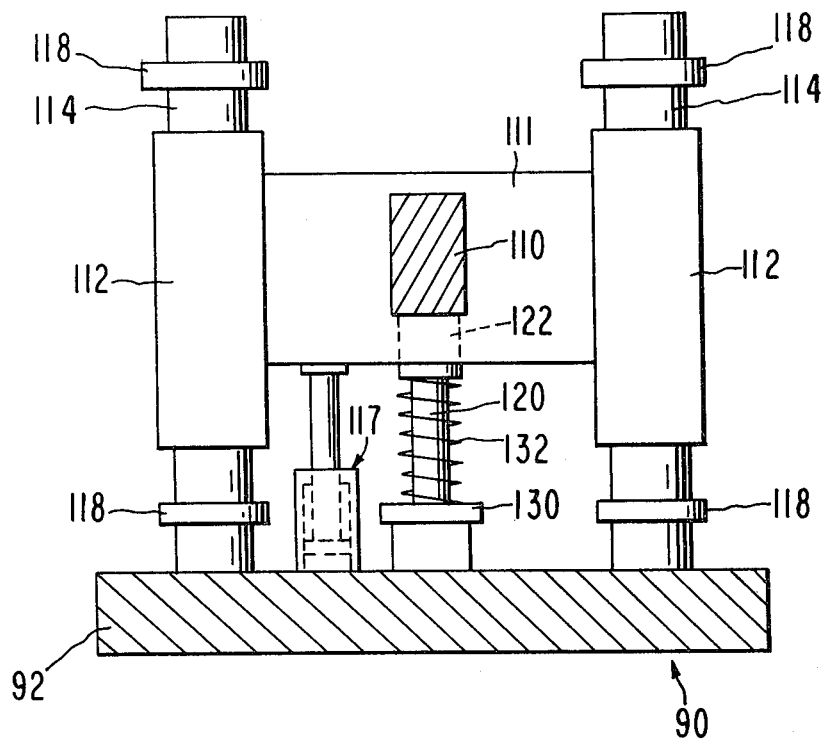
FIG. 9 is a cross-sectional view taken along line 9—9 of FIG. 8.

A first embodiment of the resistivity probe of this invention is broadly denoted by the numeral 10 and includes a rigid backing strip 12 of electrically nonconducting material, such as a rigid plastic, the strip being rectangular to present top and bottom edges 14 and 16 and side edges 18 and 20. Four electrically conducting pins 22 are bonded to one face 24 of strip 12 by an epoxy material indicated by numeral 26 (FIG. 3). The pins are parallel with each other and project beyond top and bottom edges 14 and 16 of strip 12. The lower end of each pin 22 is pointed as is well known for pins of this type. The upper end of each pin 22 has a metallic collar 28 in electrical contact therewith, and a wire 30 is connected to collar 28 and leads away therefrom for connection to circuitry for measuring resistivity when the lower ends of the pins engage a semiconductor wafer.

Strip 12 and pins 22 form a unitary construction which can be mounted in a housing coupled with elevating means for raising and lowering the housing and thereby the pins relative to a work-piece, such as a semiconductor wafer beneath the pins. For purposes of illustration, probe 10 is mounted in a housing 32 having a pair of opposed side walls 34 and a front wall 36 to present a recess of receiving probe 10 in the manner shown in FIG. 2. For mounting strip 12 to housing 32, a pair of vertical posts 38 are secured into the housing as shown in FIGS. 1 and 2 and depend from a lower surface 40 of the housing which defines the upper boundary of the recess in which probe 10 is disposed. The lower ends of posts 38 having horizontal pins 42 (FIGS. 1 and 2) received in vertical slots 43 in respective end margins of strip 12 so that the strip can move slightly in a generally vertical plane relative to housing 32. A rubber height bar 44 is mounted on surface 40 and engages the upper flat faces of pins 22 to limit the upper movement of probe 10 to permit each pin 22 to move vertically a few thousandths of an inch to allow the pin to make point contact with similar gram loading of adjacent pins 22 if there is an uneven surface or semiconductor wafer spikes.

In use, probe 10 is mounted to housing 32 in the manner described above or in any other desired manner. Then the housing is connected to elevating means (not shown) which raises and lowers the housing relative to a semiconductor wafer (not shown) beneath probe 10. When resistivity measurements are to be made, housing 32 is lowered so that the lower ends of the pins 22 will contact the wafer at the required locations by means of selected individual gram weights for proper pin loading to make the necessary measurements. After the measurements have been taken, the housing is raised so that the wafer can be rotated into another location at which resistivity measurements are to be taken. This procedure continues until all of the required resistivity measurements are taken from the semiconductor wafer. Then the wafer is replaced by another wafer and the above procedure is repeated.

The weight gram loading on the pins can be provided by one or more gram loading bars 47, two of which are shown in FIGS. 1 and 2. Suitable mounts 49 connect the bars to housing 32 and to each other.

Another embodiment of the probe of the present invention is shown in FIGS. 4 and 5 and broadly denoted by the numeral 50. Probe 50 includes a pair of spaced, rigid strips 52 and 54 of electrically nonconducting material, such as plastic, which are connected together by rivets 56 or other fasteners for mounting therebetween four pins 58 which are used to make resistivity measurements in the same way as pins 22 of probe 10 mentioned above. Each of strips 52 and 54 have four semi-cylindrical recesses on the inner face thereof for receiving pins 58. The semi-cylindrical recesses of the two strips 52 and 54 mate with each other so that the pins will be captured by the strips and movable slightly vertically in the recesses when the strips are in the positions as shown in FIG. 5. Collars 59 on respective pins 58 limit the downward movement of the pins since the collars normally engage the upper margins of strips 52 and 54. The collars are electrically conductive and are used for the same purpose as collars 28.

The width of the strips is less than the lengths of pins 58 so that the pins project above and below the strips as shown in FIG. 4. The lower ends of the pins are pointed so that point contact can be made at various locations on a semiconductor wafer when the resistivity is to be measured.

Probe 50 can be mounted in any suitable manner, such as in the manner shown in FIGS. 1 and 2 with reference to probe 10. Moreover, the two strips 52 and 54 may be connected in a manner such that slight movement of pins 58 relative to strips 52 and 54 is allowed to compensate for uneven surface on the wafer whose resistivity is to be measured. However, the upper flat faces of pins 58 will generally engage a height bar (not shown), such as bar 44 of rubber, to limit upward movement of the pins relative to strips 52 and 54.

Another embodiment of the invention is shown in FIGS. 6 and 7 and is to be used when making multiple resistivity measurements at various locations on a semiconductor wafer simultaneously. To this end, a disk-like body 60 has a plurality of angularly disposed slots 62 formed therein and extending between the opposed flat faces thereof. For purposes of illustration, there are six slots 62 and each slot is adapted to receive a probe 64 having pins 66 mounted thereon. Each probe 64 can be of the type shown in FIGS. 1-3 or of the type shown in FIGS. 4 and 5. The width of each slot 62 will be selected so that it will accommodate the desired width of the corresponding probes.

The slot 62 and probes 64 are symmetrical about the central axis 68 of body 60. The probes have strips 70 to which the pins 66 are coupled and the strips are cut away at the opposed ends thereof at the lower margins to present shoulders 72 (FIG. 7) which engage lateral projections 74 to seat the probes in respective slots 62 so that the lower ends of pins 66 uniformly project downwardly from the lower face 76 of body 60. A rubber height bar 78 is in each slot 62 above and in engagement with the upper flat faces of pins 66, and a cover plate 80 is attached to the upper flat face of body 60 and prevents upper movement of the height bars 78. Collars (not shown), such as collars 28 and 58, are coupled with pins 66 of each probe 64 to connect electrical leads thereto. Cover plate 80 is secured by fasteners 82 to body 60.

In use, body 60 with probes 64 coupled thereto is secured to elevating means to raise and lower body 60 and thereby the various probes 64 relative to a semiconductor wafer beneath the body. When the lower ends of the pins of the various probes engage the wafer, a plurality of resistivity measurements can be successively made at the various locations on the wafer so that the totality of the resistivity measurements can be taken in much shorter time than would be required if a single probe 64 were used because the probe assembly need not be rotated as in the case of a single probe. In this way, the wafers can be more effectively handled and wafer production costs will be reduced proportionately. Gram loading bars can also be used with the probe assembly of FIGS. 6 and 7.

FIG. 8 shows a probe mounting stand for use in raising and lowering one or more probes for making resistivity measurements. The stand, broadly denoted by the numeral 90, includes a base plate 92 having an upper surface 94 provided with a recess 96 therein in which a chuck 98 is adjustably and slidably mounted. The chuck has an upper feat surface 100 for supporting a semiconductor wafer 102 whose resistivity is to be measured at various locations. Means (not shown) for moving the chuck allows the wafer 102 to move beneath a probe head 104 which includes a probe 106 having vertical pins for making electrical contact with the wafer. Probe 106 can be of the type shown in FIGS. 1-3 or can be of the type shown in FIGS. 4 and 5. In the alternative, a multiple probe assembly of the type shown in FIGS. 6 and 7 can be used in lieu of a single probe 106. If the multiple probe assembly is used, body 60 of the probe is mounted in any suitable manner on probe head 104 so that the multiple probe assembly will be raised and lowered as probe head 104 is raised and lowered. Also, gram loading bars can be used with probe head 104 as described about with respect to the embodiments of FIGS. 1-7.

Probe head 104 is secured to one end 108 of a vertically shiftable arm 110 projecting through a cross beam 111 rigid to and spanning a pair of vertical tubes 112, each tube 112 being shiftably mounted on a respective upright post 114 having a lower end 116 threadably mounted in base plate 92. An adjustable counter weight 116 is mounted near one end of arm 110. Each post 114 has upper and lower adjustable stops 118 for limiting the upward and downward movements of tubes 112 relative to post 114.

Means for raising and lowering arm 110 and thereby tubes 112 includes a power device 117, such as a fluid actuator, carried on base plate 92 and having a shiftable arm whose upper end engages the underside of cross beam 111. Control means (not shown) is provided for device 117 to cause arm 110 to be raised.

Means to allow gentle lowering of arm 110 includes a vertical shaft 120 having a head 122 on the upper end thereof for normally engaging the lower surface 124 of arm 110. Shaft 120 forms part of a governor or control which allows arm 110 to settle at a controlled rate of speed depending upon the gram loading of the probe head. The governor can be of any suitable construction, such as electrical, pneumatic, hydraulic or vacuum. For purposes of illustration, shaft 120 is controlled pneumatically and, to this end, shaft 120 has a piston 126 on its lower end which is received within a cylindrical recess 128 formed in the upper surface 94 of base plate 92. A seal 130 surrounds shaft 120 and seals the upper end of the recess in which piston 126 is disposed yet the piston can move up and down in the recess. A coil spring 132 surrounds shaft 120 and extends between head 122 and seal 130 to bias shaft 120 upwardly. An air inlet 34 is in fluid communication with the recess above piston 126 so that, when air is forced into the recess below the piston, the piston is cushioned, causing shaft 120 to be slowly lowered to allow arm 110 and thereby probe head 104 to be gently lowered. Suitable control structure (not shown) will be provided to control the flow of air into and out of the recess.

In operation, probe head 104 is provided with one or more probes. For purposes of illustration, only a single probe 106 of the type shown in FIGS. 1-3 or the type shown in FIGS. 4 and 5 is provided at the lower extremity of probe head 104. With a wafer 102 on chuck 98, the probe head is lowered by de-actuating device 117 while actuating the control circuitry which allows air under pressure to enter the recess below piston 126. Thereupon, the weight of arm 110 causes it to be lowered against the bias force of spring 132, yet the air below piston 126 allows arm 110 and thereby the probe head to be lowered gently and at a controlled rate until the pins of probe 106 engage the wafer at the proper locations. Then, resistivity measurements can be taken, following which device 117 is actuated so that the probe head is raised slightly to shift chuck 98 to reposition wafer 102 for making the next set of measurements. This procedure continues until all of the required resistivity measurements have been taken from the wafer. Then the wafer is removed from the chuck and replaced by another wafer whose resistivity values are to be measured. If the probe assembly shown in FIGS. 6 and 7 is used, many resistivity measurements can be made simultaneously to avoid having to rotate the probe pins as required with a single probe head. Chuck 98 does not need to be moved, thereby saving time in making multiple measurements.

I claim:

1. A mount for a resistivity probe comprising: a base plate; means on said base plate for shiftably mounting a semiconductor wafer in an operative position thereon; a post secured to and extending upwardly from said base plate at a location spaced from said wafer mounting means; an arm; a tube shiftably mounted on the post and a crossbeam extending laterally from the tube, said crossbeam being coupled with the arm for mounting the same for up and down movement with the tube on the post, said arm extending laterally from the crossbeam and having an outer end provided with a probe head thereon, the probe head being above and generally vertically aligned with said operative position, there being a pair of stops adjustably carried by the post to limit the vertical movement of the tube on the post; and means carried by said base plate below said arm for moving the same up and down relative to said base plate to thereby cause the probe head to be raised and lowered relative to said operative position, there being a control device coupled with the arm to allow it to descend at a controlled rate.

2. A mount as set forth in claim 1, wherein is included a counterweight adjustably mounted on the arm.

3. A mount as set forth in claim 1, wherein said control device includes a vertically shiftable shaft having an upper end normally engaging the arm, and power means coupled with said shaft for moving the same downwardly therebeing bias means coupled with said shaft for biasing the same upwardly.

4. An assembly as set forth in claim 3, wherein said power means is electrically actuated.

5. An assembly as set forth in claim 3, wherein said power means is pneumatically actuated.

6. An assembly as set forth in claim 3, wherein said power means is hydraulically actuated.

7. An assembly as set forth in claim 3, wherein said power means is operated by suction.

* * * * *